United States Patent
Park et al.

(10) Patent No.: US 9,230,667 B2
(45) Date of Patent: Jan. 5, 2016

(54) SEMICONDUCTOR DEVICE

(71) Applicant: SK hynix Inc., Gyeonggi-do (KR)

(72) Inventors: Yi Seul Park, Gyeonggi-do (KR); Chul Woo Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/327,160

(22) Filed: Jul. 9, 2014

(65) Prior Publication Data

US 2015/0228349 A1 Aug. 13, 2015

(30) Foreign Application Priority Data

Feb. 7, 2014 (KR) .................. 10-2014-0014297

(51) Int. Cl.
| | |
|---|---|
| *G11C 16/06* | (2006.01) |
| *G11C 16/22* | (2006.01) |
| *G11C 16/14* | (2006.01) |
| *G11C 16/26* | (2006.01) |

(52) U.S. Cl.
CPC ................ *G11C 16/22* (2013.01); *G11C 16/14* (2013.01); *G11C 16/26* (2013.01)

(58) Field of Classification Search
CPC ........... G11C 11/5621; G11C 11/5628; G11C 11/5642; G11C 16/0483; G11C 2211/5621; G11C 2211/5641; G11C 2211/5642; G11C 7/1039
USPC ............ 365/219, 168, 185.03, 185.2, 185.23, 365/184.24, 189.07, 230.06, 49.1
See application file for complete search history.

(56) References Cited

U.S. PATENT DOCUMENTS

2012/0008413 A1 * 1/2012 Jeong ........................ 365/185.24

FOREIGN PATENT DOCUMENTS

KR 1020100099960 9/2010

* cited by examiner

*Primary Examiner* — Thong Q Le
(74) *Attorney, Agent, or Firm* — IP & T Group LLP

(57) ABSTRACT

A semiconductor device includes a memory block including memory cells for storing program data and one or more flag cells for storing erase state information, an operation circuit suitable for performing a program operation, an erase operation, and a read operation on the memory cells and the flag cell, and a data conversion circuit suitable for encoding read data read from the memory cells based on the erase state information.

24 Claims, 9 Drawing Sheets

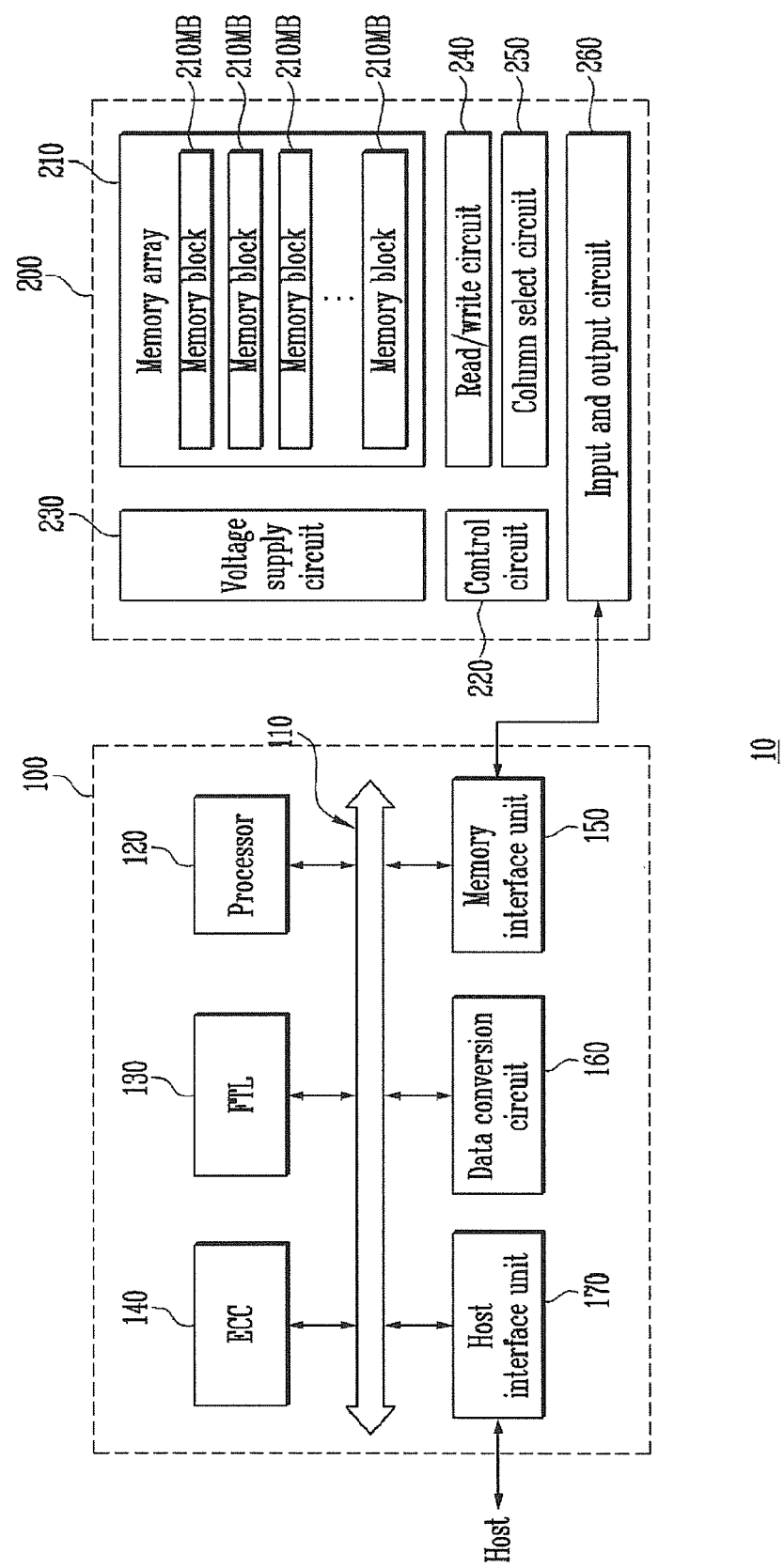

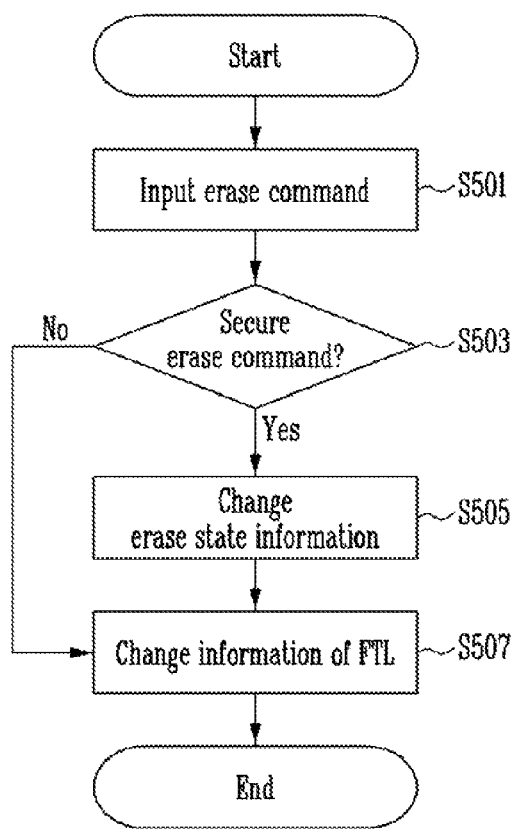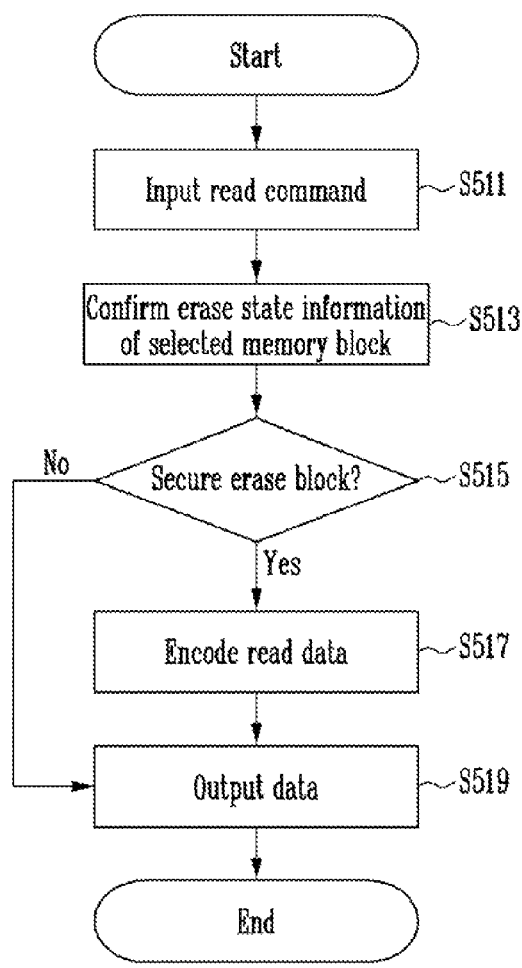

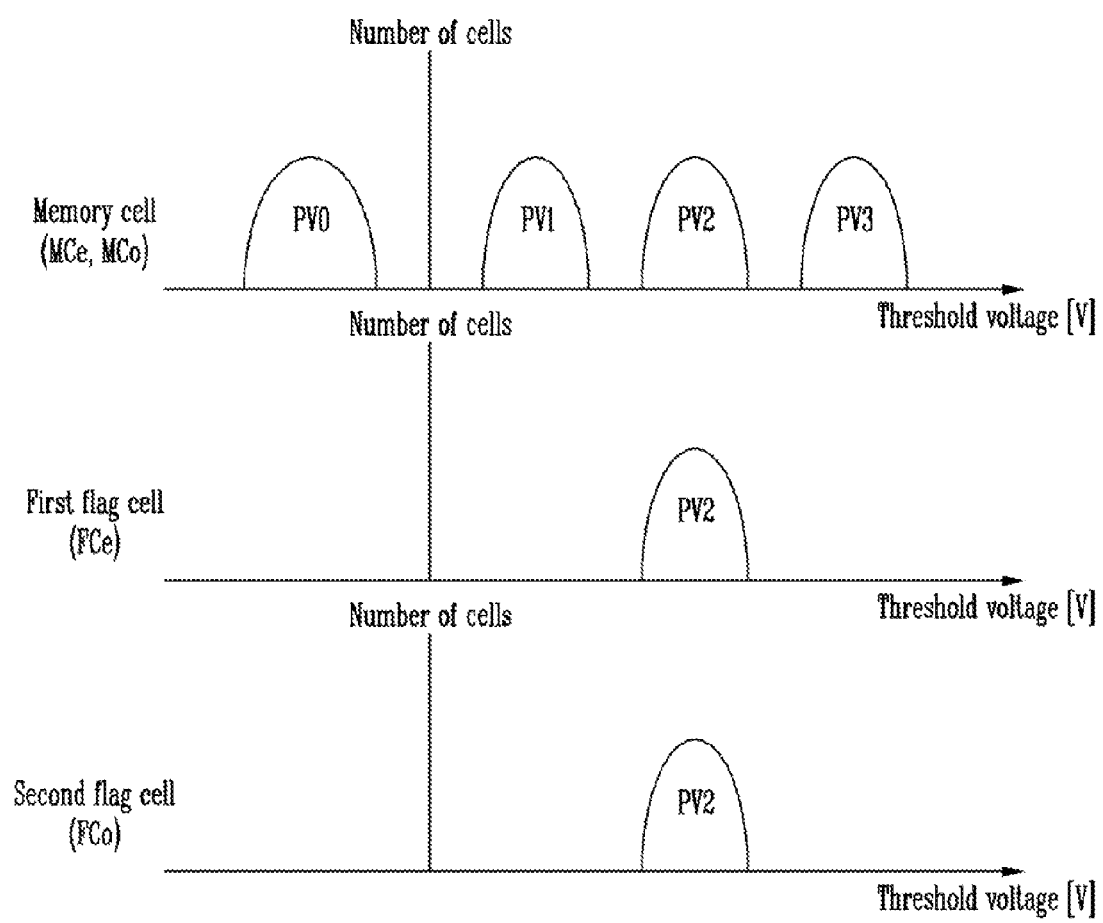

SEMICONDUCTOR DEVICE

CROSS-REFERENCE TO RELATED APPLICATION

The present application claims priority to Korean patent application number 10-2014-0014297, filed on Feb. 7, 2014, the entire disclosure of which is incorporated herein in its entirety by reference.

BACKGROUND

1. Field of Invention

Various embodiments of the present invention relate generally to a semiconductor device, and more particularly, to a semiconductor device including memory cells.

2. Description of Related Art

When an erase command is inputted from a host, data of a corresponding memory block is not actually erased, and only meta-information is erased from the file system. Therefore, the data of the memory block, which should have been erased, may be recovered maliciously.

SUMMARY

Embodiments of the present invention are directed to a semiconductor device capable of protecting data safely.

One embodiment of the present invention provides a semiconductor device including a memory block having memory cells for storing program data and one or more flag cells for storing erase state information, an operation circuit suitable for performing a program operation, an erase operation, and a read operation on the memory cells and the flag cell, and a data conversion circuit suitable for encoding read data read from the memory cells according to the erase state information.

Another embodiment of the present invention provides a semiconductor device including a memory device having a memory block for storing erase state information, wherein the memory device is suitable for performing a program operation, an erase operation, and a read operation on the memory block, and a controller suitable for encoding read data read from memory cells of the memory block based on the erase state information.

BRIEF DESCRIPTION OF THE DRAWINGS

FIG. 1 is a block diagram illustrating a semiconductor device according to an embodiment of the present invention;

FIGS. 5A and 5B are flowcharts illustrating operations of a semiconductor device according to an embodiment of the present invention; and FIGS. 6A to 6C are waveforms illustrating operations of a semiconductor device according to an embodiment of the present invention.

DETAILED DESCRIPTION

Figure 2A:
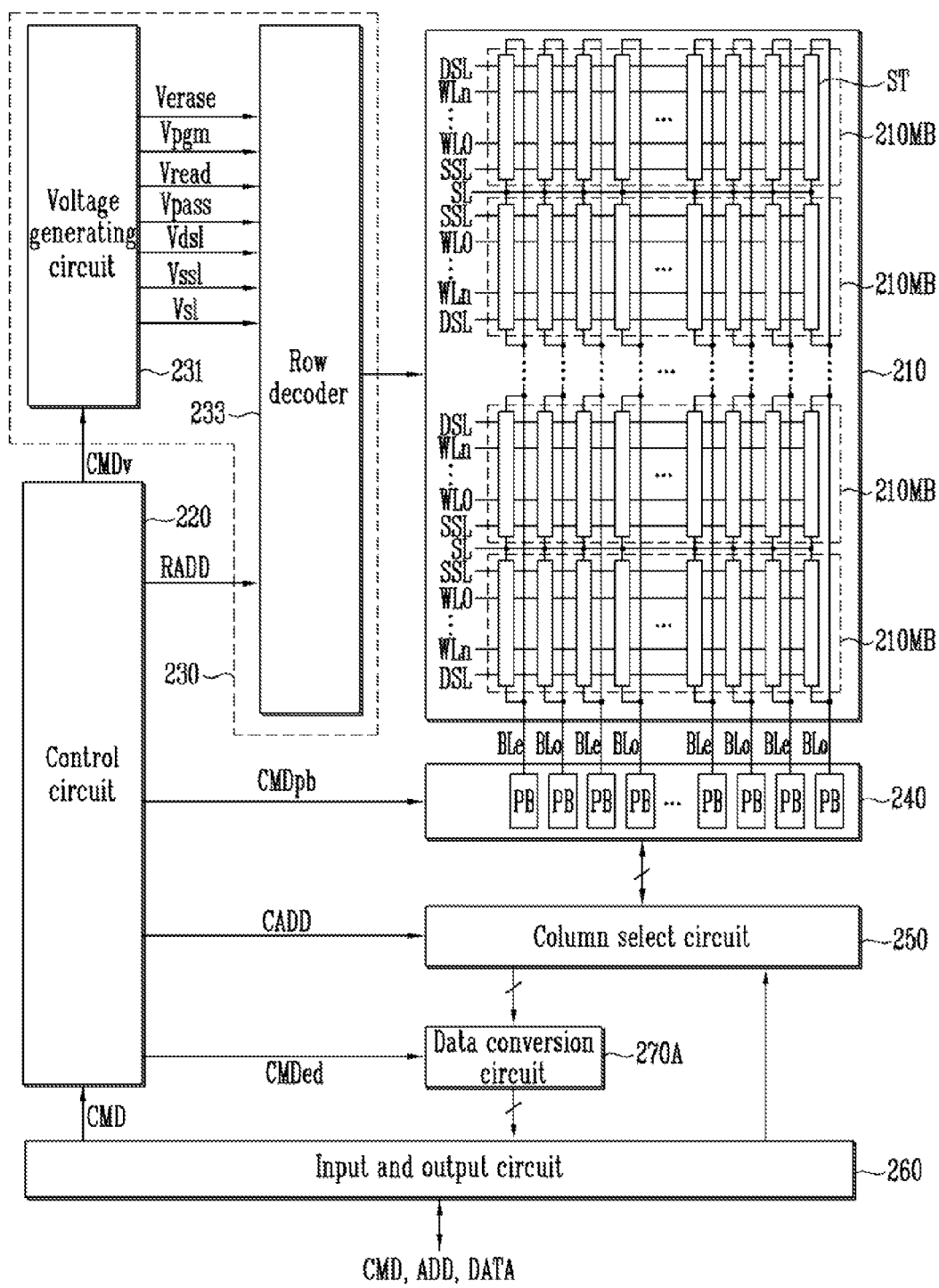
FIGS. 2A and 2B are block diagrams illustrating a semiconductor device according to another embodiment of the present invention.

Hereinafter, various embodiments of the present invention will be described in detail with reference to the accompanying drawings. The figures are provided to enable those of ordinary skill in the art to make and use the present invention according to the embodiments of the present invention. Throughout the disclosure, like reference numerals correspond directly to the like numbered parts in the various figures and embodiments of the present invention. It is also noted that in this specification, "coupled/coupling" refers to one component not only directly coupling another component but also indirectly coupling another component through an intermediate component. In addition, a singular form may include a plural form, and vice versa, as long as it is not specifically mentioned.

FIG. 1 is a block diagram illustrating a semiconductor device according to one embodiment of the present invention.

Referring to FIG. 1, a semiconductor device 10 may include a memory controller 100 and a memory device 200. The memory controller 100 may be coupled to a host HOST and the memory device 200. In response to a request of the host HOST, the memory controller 100 may be configured to access the memory device 200. For example, the memory controller 100 may be configured to control a read operation, a program loop, and an erase loop of the memory device 200. The memory controller 100 may be configured to provide an interface between the memory device 200 and the host HOST. The memory controller 100 may be configured to drive firmware for controlling the memory device 200. The memory device 200 may include a flash memory device.

The memory controller 100 may include an internal bus 110, a processor 120, a flash translation layer (FTL) 130, an error correcting code (ECC) unit 140, a memory interface unit 150, a data conversion circuit 160 and a host interface unit 170. The internal bus 110 may be configured to provide a channel between the components of the memory controller 100. For example, the internal bus 110 may be a common channel for transferring a command and data. In another example, the internal bus 110 may include a command channel and a data channel for transferring the command and the data, respectively.

The processor 120 may be configured to control overall operations of the memory controller 100. The processor 120 may be configured to execute software and firmware driven in the memory controller 100.

The FTL 130 may provide various control means for controlling the memory device 200. When the memory device 200 is a flash memory device, the flash memory device 200 may have different characteristics from a conventional memory device. First, the flash memory device 200 may perform an erase operation before a program operation (erase-before-write characteristics). Secondly, the read operation, the program loop, and the erase loop of the flash memory device 200 may be performed on the basis of different units. More specifically, the read operation and the program loop of the flash memory device 200 may be performed on each page as the basic unit, and the erase loop of the flash memory device 200 may be performed on each memory block as the basic unit. The memory block may include a plurality of pages. Thirdly, the number of repetitions of the program loop and the erase loop of the flash memory device 200 may be limited. Lastly, the erase time, the program time, and the read time of the flash memory device 200 may be different.

When the host HOST accesses the flash memory device 200, the FTL 130 may provide various control means based on the characteristics of the flash memory device 200 described above. For example, the FTL 130 may provide a means for converting a logical address received from the host HOST into a physical address of the flash memory device 200. The FTL 130 may include a mapping table indicating a mapping relation between the logical address and the physical address. The FTL 130 may provide a means for controlling the number of program operations and the number of erase operations of memory blocks 210MB of the flash memory device 200 to be equal. For example, the FTL 130 may provide a wear leveling means. The FTL 130 may provide a means for minimizing the number of erase operations of the flash memory device 200. For example, the FTL 130 may provide a control means such as a merge operation and a garbage collection means, etc.

When a normal erase command or a secure erase command is inputted for the erase operation, the memory controller 100 may change meta-information of the memory block stored in the FTL 130. For example, the memory controller 100 may include an address of a corresponding memory block in an address of an erase state in response to the erase command.

The ECC unit 140 may be configured to detect and correct an error of data read from the memory device 200.

The memory interface unit 150 may include a protocol for communicating with the flash memory device 200. For example, the memory interface unit 150 may include at least one flash interface such as a NAND interface, a NOR interface, etc.

The data conversion circuit 160 may encode data to be stored in memory cells of the memory blocks 210MB in the program operation and decode data read from the memory cells of the memory blocks 210MB in the read operation.

The host interface unit 170 may include a protocol for performing data exchange between the host HOST and the memory controller 100. For example, the memory controller 100 may be configured to communicate with the outside (the host) through at least one among various interface protocols such as a Universal Serial Bus (USB) protocol, a MultiMedia Card (MMC) protocol, a Peripheral Component Interconnect (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, an Integrated Drive Electronics (IDE) protocol, etc.

Although not shown in FIG. 1, the memory controller 100 may further include a storing unit. The storing unit may function as an operation memory of the processor 120, a buffer memory between the memory device 200 and the host HOST, and a cache memory between the memory device 200 and the host HOST. In addition, the storing unit may function as a buffer for temporarily storing data inputted from the memory device 200.

For example, the storing unit may include at least one among various memories capable of performing a random access operation, such as static random access memory (SRAM), dynamic RAM (DRAM), synchronous DRAM (SDRAM), phase-change RAM (PRAM), magnetoresistive RAM (MRAM), resistive RAM (RRAM), ferroelectric RAM (FRAM), NOR flash memory, or the like.

Erase state information of the memory blocks 210MB may be temporarily stored in the storing unit, and the data conversion circuit 160 may selectively perform the operation of encoding data in the read operation based on the erase state information stored in the storing unit.

The memory device 200 may include a memory array 210 and an operation circuit 220 to 260. When the memory device 200 is a NAND flash memory device, the operation circuit may include a control circuit 220, a voltage supply circuit 230, a read/write circuit 240, a column select circuit 250, and an input and output circuit 260. Each of these circuits of the memory device 200 will be described in detail.

The memory device 200 may include the memory blocks 210MB for storing the erase state information, and may be configured to perform the program operation, the erase operation, and the read operation of the memory blocks 210MB. The memory controller 100 may be configured to encode data read from memory cells of the memory blocks 210MB based on the erase state information. When the normal erase command is inputted for the erase operation, the memory controller 100 may change the meta-information related to the memory blocks 210MB in the FTL 130. Further, when the secure erase command is inputted for the erase operation, the memory controller 100 may change the meta-information related to the memory blocks 210MB in the FTL 130, and the memory device 200 may change the erase state information to be stored in a flag cell (not shown) of a selected memory block 210MB.

Specifically, before the memory controller 100 outputs data inputted from the memory blocks 210MB of the memory device 200 to the host HOST, the data conversion circuit 160 may selectively perform the operation of encoding data read from the memory blocks 210MB based on the erase state information of the memory blocks 210MB. For example, when a user tries to abnormally recover data of an erased memory block 210MB, the read operation may be performed. In this case, when the memory block 210MB for performing a read operation is in a secure erase state based on the erase state information in the read operation, the data conversion circuit 160 may encode the data read from the memory cells. As the encoded data is outputted from the memory controller 100 to the host HOST, the data may be prevented from being abnormally recovered and may be safely protected. A detailed operation method will be described hereinafter.

Figure 2B:
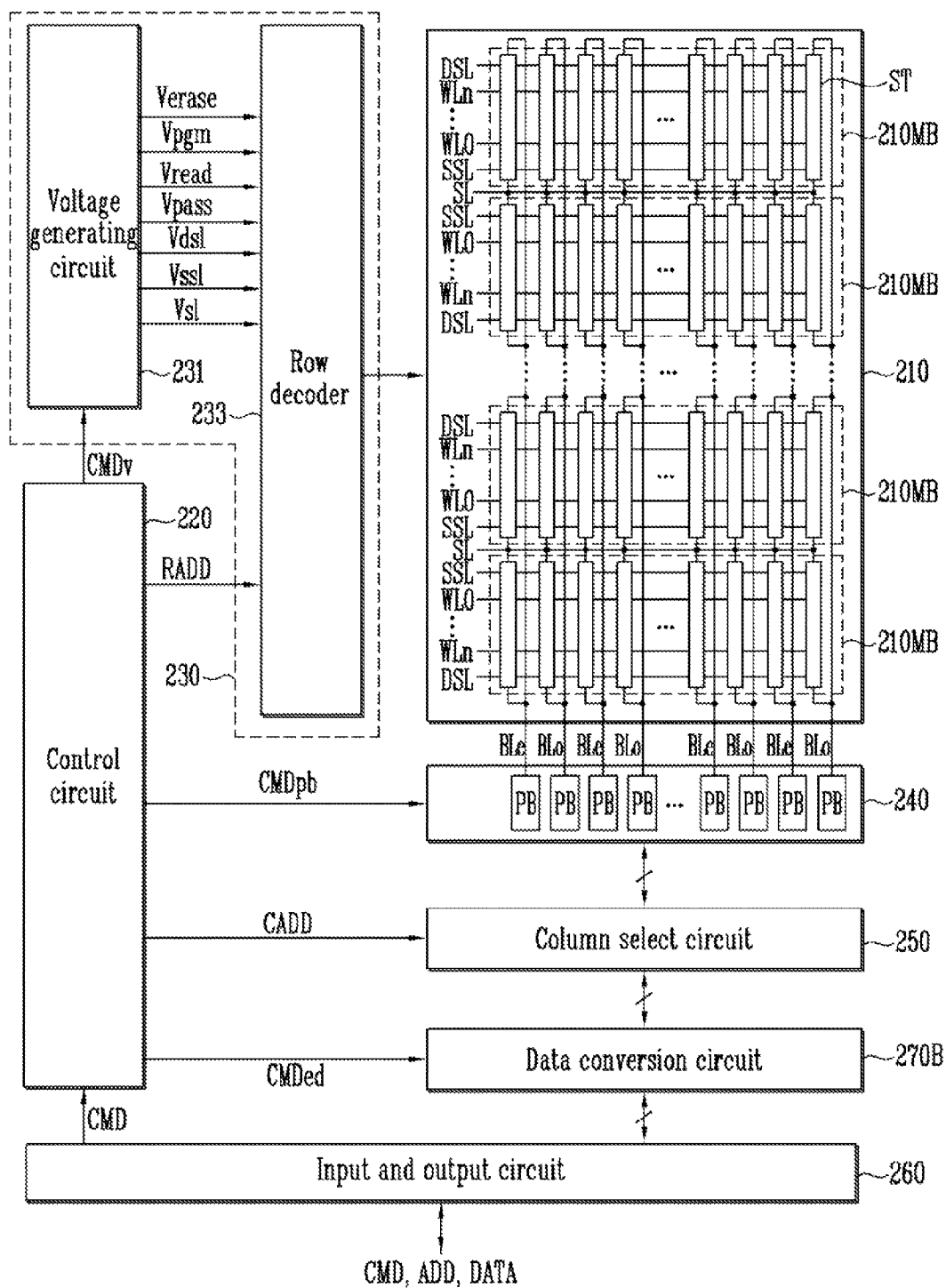
Figure 3:
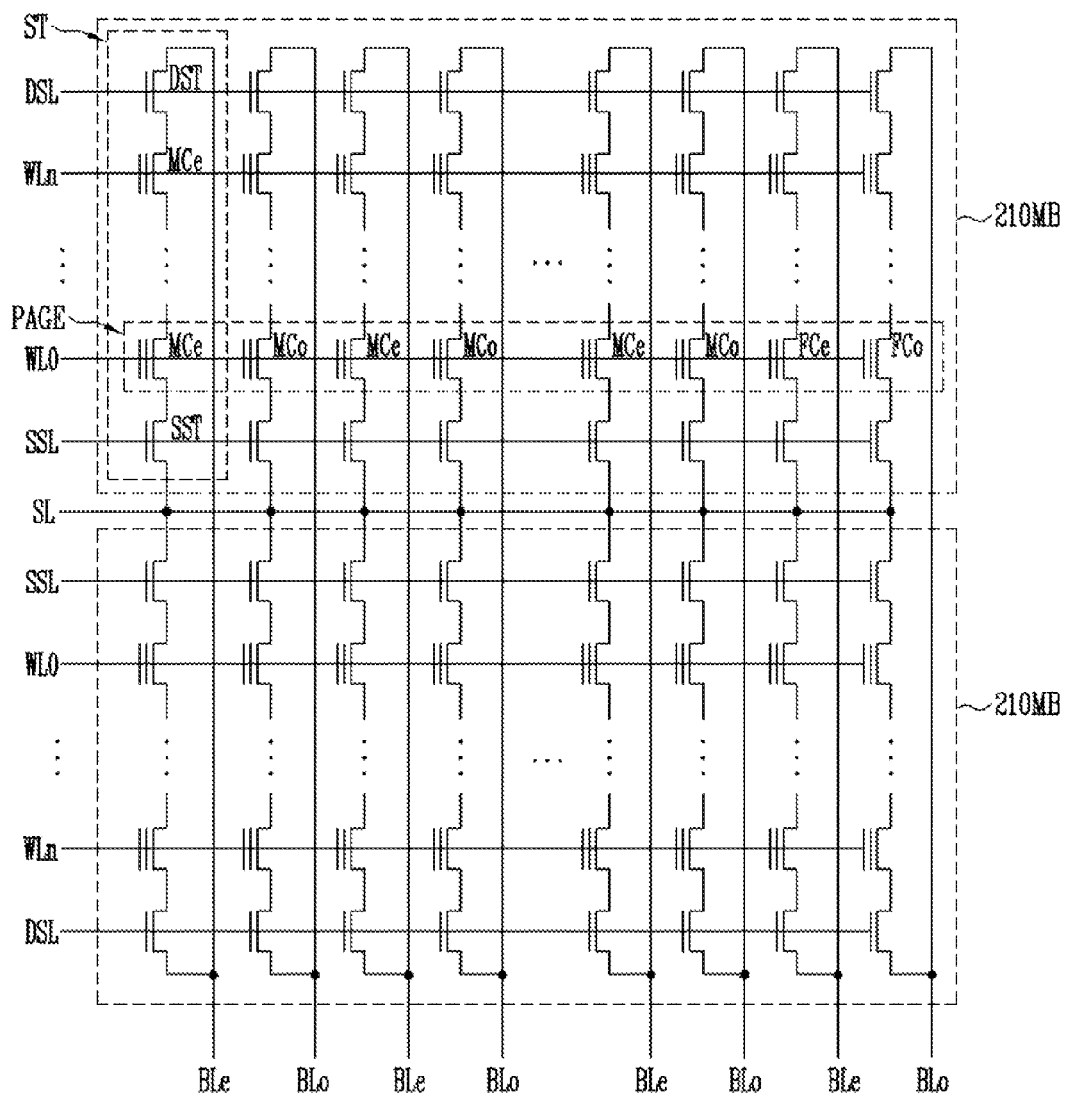
FIG. 3 is a circuit diagram illustrating a memory block of the semiconductor device according to embodiments of the present invention.

The data is encoded or decoded in the data conversion circuit 160 of the memory controller 100 in the above description. However, the data conversion circuit 160 may be included in the memory device 200 and the data may be encoded or decoded in the memory device 200. A detailed description thereof is as follows. FIGS. 2A and 2B are block diagrams illustrating a semiconductor device according to another embodiment of the present invention. FIG. 3 is a circuit diagram illustrating a memory block of a semiconductor device according to embodiments of the present invention.

Referring to FIG. 2A, a semiconductor device may include a memory array 210, an operation circuit 220 to 260, and a data conversion circuit 270A.

The memory array 210 may include a plurality of memory blocks 210MB. Each of the memory blocks 210MB may include memory cells MCe and MCo and flag cells FCe and FCo, and the structure of the memory block 210MB will be described below.

Referring to FIG. 3, each of the memory blocks 210MB may include a plurality of memory strings ST coupled between bit lines BLe and BLo and a common source line SL. The memory cells MCe and MCo and the flag cells FCe and FCo may be coupled to each of the word lines WL0 to WLn. Program state information of the memory cells MCe and MCo may be stored in the first flag cell FCe. In other words, the program state information that confirms whether one-bit data or two-bit data is stored in the memory cells MCe and MCo may be stored depending on whether a most significant bit (MSB) program operation is performed. The erase state information may be stored in the second flag cell FCo. For example, when the memory block is in a non-erase state or a normal erase state, the erase state information may be stored as first data in the second flag cell FCo by the operation circuit, and when the memory block is in a secure erase state, the erase state information may be stored as second data in the second flag cell FCo by the operation circuit. In another example, when the memory block is in the secure erase state in response to the secure erase command, the second flag cell FCo may be changed from the erase state into the program state by the operation circuit.

The memory strings ST may be coupled to the bit lines BLe and BLo, respectively, and be commonly coupled to the common source line. SL. Each of the memory strings ST may include a source select transistor SST having a source coupled to the common source line SL, a cell string having a plurality of memory cells MC coupled in series, and a drain select transistor DST having a drain coupled to the bit line BL. The memory cells MC included in the cell string may be serially coupled between the select transistors SST and DST. A flag memory string may include a source select transistor SST having a source coupled to the common source line SL, a flag cell string having a plurality of flag cells FC serially coupled, and a drain select transistor DST having a drain coupled to the bit line BL. The flag cells FC included in the flag cell string may be serially coupled between the select transistors SST and DST.

In each of the memory strings ST, a gate of the source select transistor SST may be coupled to a source select line SSL, gates of the memory cells MC (or gates of the flag cells FC in the flag memory string) may be coupled to the word lines WL0 to WLn, respectively, and a gate of the drain select transistor DST may be coupled to a drain select line DSL. Here, the drain select transistor DST may control the connection or disconnection between a corresponding cell string and a bit line BLe or BLo, and the source select transistor SST may control connection or disconnection between a corresponding cell string and the common source line SL.

In a NAND flash memory device, the memory cells MCe and MCo and the flag cells FCe and FCo included in the memory block may be divided into physical page units or logical page units. For example, the cells MCe, MCo, FCe, and FCo coupled to one word line (for example, WL0) may form one physical page PAGE. Further, even-numbered cells MCe and FCe coupled to one word line (for example, WL0) may form an even page, and odd-numbered cells MCo and FCo coupled to one word line (for example, WL0) may form an odd page. The page (or, even page and odd page) may be a basic unit for the program operation or the read operation.

Referring to FIG. 2A again, the operation circuit 220 to 260 may be configured to perform the program loop, the erase loop, and the read operation of the cells MCe MCo, FCe, and FCo coupled to a selected word line (for example, WL0). The program loop may include the program operation and a program verifying operation, and the erase loop may include the erase operation and an erase verifying operation.

In order to perform the program loop, the erase loop, and the read operation, the operation circuit 220 to 260 may be configured to selectively output operation voltages Verase, Vpgm, Vread, Vpass, Vdsl, Vssl, and Vsl to local lines SSL, WL0 to WLn, and DSL and the common source line SL of a selected memory block, and control precharge/discharge on the bit lines BLe and BLo or sense current on the bit lines BLe and BLo.

When the memory device 200 is a NAND flash memory device, the operation circuit 220 to 260 may include the control circuit 220, the voltage supply circuit 230, the read/write circuit 240, the column select circuit 250, and the input and output circuit 260. Each component will be described below in detail.

The control circuit 220 may output a voltage control signal CMDv for controlling the voltage supply circuit 230 such that the operation voltages Verase, Vpgm, Vread, Vpass, Vdsl, Vssl, and Vsl for performing the program loop, the erase loop, and the read operation may be generated at predetermined levels, in response to a command CMD inputted through the input and output circuit 260 from the external device. The control circuit 220 may control page buffers PB included in the read/write circuit 240 for performing the program loop, the erase loop, and the read operation. Further, when an address ADD is inputted, the control circuit 220 may generate a column address CADD and a row address RADD from the address ADD, and the column address CADD and the row address RADD may be outputted from the control circuit 220.

The voltage supply circuit 230 may generate the operation voltages Verase, Vpgm, Vread, Vpass, Vdsl, Vssl, and Vsl for the program loop, the erase loop, and the read operation of the memory cells in response to the voltage control signal CMDv of the control circuit 220, and output the operation voltages to the local lines SSL, WL0 to WLn, and DSL and the common source line SL of a selected memory block, in response to the row address RADD of the control circuit 220.

The voltage supply circuit 230 may include a voltage generating circuit 231 and a row decoder 233. The voltage generating circuit 231 may generate the operation voltages Verase, Vpgm, Vread, Vpass, Vdsl, Vssl, and Vsl in response to the voltage control signal CMDv, and the row decoder 233 may transfer the operation voltages to the local lines SSL, WL0 to WLn, and DSL and the common source line SL of a selected memory block, among the memory blocks 210MB, in response to the row address RADD of the control circuit 220.

As described above, the voltage supply circuit 230 may output and change the operation voltages Verase, Vpgm, Vread, Vpass, Vdsl, Vssl, and Vsl in response to the voltage control signal CMDv of the control circuit 220, which will be described below.

The read/write circuit 240 may include a plurality of page buffers PB coupled to the memory array 210 through the bit lines BLe and BLo. The page buffers PB may be coupled to the bit lines BLe and BLo, respectively. In other words, one page buffer PB may be coupled to one bit line BL. In the program operation, the page buffers PB may selectively precharge the bit lines BLe and BLo in response to a page buffer (PB) control signal CMDpb of the control circuit 220 and data to be stored in the memory cells. In the program verifying operation or the read operation, the page buffers PB may latch data read from the cells MCe, MCo, FCe, and FCo by sensing voltage changes or currents of the bit lines BLe and BLo after precharging the bit lines BLe and BLo, in response to the PB control signal CMDpb of the control circuit 220.

The column select circuit 250 may select the page buffers PB included in the read/write circuit 240 in response to the column address CADD outputted from the control circuit 220. In other words, the column select circuit 250 may sequentially transfer data to be stored in the memory cells to the page buffers PB in response to the column address CADD. Further, the column select circuit 250 may sequentially select the page buffers PB in response to the column address CADD such that the data of the memory cells latched in the page buffers PB in the read operation may be externally outputted.

The input and output circuit 260 may transfer the command CMD and the address ADD inputted from the external device to the control circuit 220. Further, the input and output circuit 260 may transfer data DATA inputted from the external device to the column select circuit 250 in the program operation, or output data read from the memory cells to the external device in the read operation.

The data conversion circuit 270A may be coupled between the column select circuit 250 and the input and output circuit

260. Before data read from the memory cells is outputted through the input and output circuit 260, the data conversion circuit 270A may selectively encode the read data based on the erase state information. Therefore, the data conversion circuit 270A may be operated in response to a control signal CMDed of the control circuit 220, and the control circuit 220 may control the data conversion circuit 270A based on the erase state information of the memory block in the read operation.

For example, when the memory block is confirmed to be in the non-erase state or the normal erase state on the basis of the erase state information, the data conversion circuit 270A may not encode the read data and the operation circuit 220 to 260 may output the read data as it is. When the memory block is confirmed to be in the secure erase state on the basis of the erase state information, the data conversion circuit 270A may encode data read from the memory cells by the operation circuit 220 to 260, and the encoded data may be outputted by the operation circuit (particularly, the input and output circuit 260).

Figure 4A:
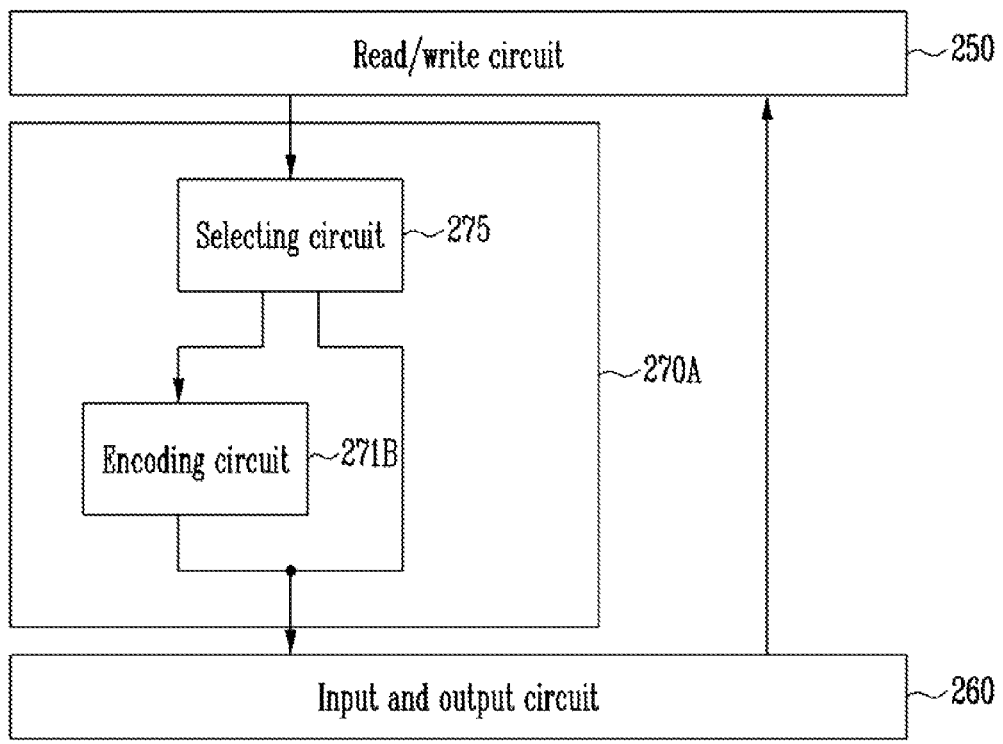
FIGS. 4A and 4B are block diagrams illustrating a data conversion circuit of a semiconductor device according to an embodiment of the present invention.
Figure 4B:
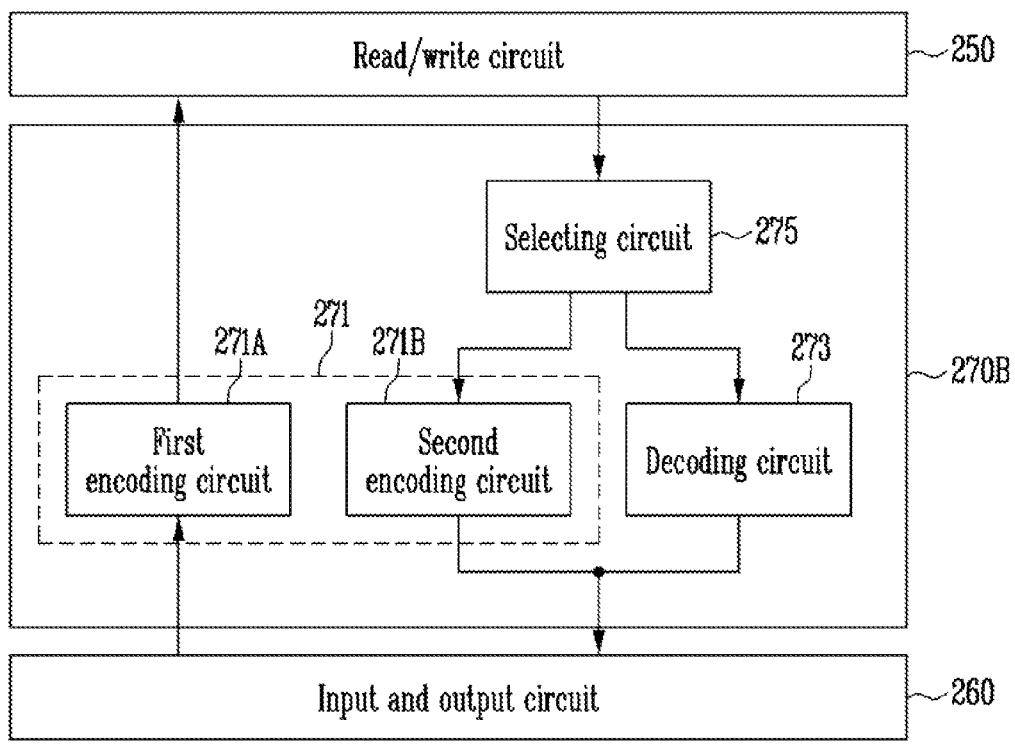

An embodiment of the data conversion circuit 270A will be described below in detail. FIGS. 4A and 4B are block diagrams illustrating a data conversion circuit of a semiconductor device according to an embodiment of the present invention.

Referring to FIG. 4A, the data conversion circuit 270A may include a selecting circuit 275 and an encoding circuit 271B. In the read operation, when a selected memory block is in the non-erase state or the normal erase state, the selecting circuit 275 may transfer data read from the memory block (i.e., data inputted from the read/write circuit 250) to the input and output circuit 260. In the read operation, when the selected memory block is in the secure erase state, the selecting circuit 275 may transfer data read from the memory block to the encoding circuit 271B. The encoding circuit 271B may encode the data read from the memory block, and output the encoded data to the input and output circuit 260.

As described above, the data is encoded when the read operation is performed. However, the data may also be encoded when the program operation is performed. A detailed description thereof is as follows.

Referring to FIG. 2B, the memory array 210, the control circuit 220, the voltage supply circuit 230, the read/write circuit 240, the column select circuit 250, and the input and output circuit 260 may have the same configuration as the memory array 210 and the operation circuit 220 to 260 described in FIG. 2A.

The data conversion circuit 270B may be coupled between the column select circuit 250 and the input and output circuit 260. The data conversion circuit 270B may encode data to be stored in the memory cells in the program operation for storing the data inputted through the input and output circuit 260 in the memory cells. The encoded data may be transferred to the read/write circuit 240 by the column select circuit 250, and the voltage supply circuit 230 and the read/write circuit 240 may perform the program operation for storing the encoded data by the data conversion circuit 270B in the memory cells under the control of the control circuit 220.

In the read operation, when a selected memory block 210MB is confirmed to be in the non-erase state, data read from the memory cells by the voltage supply circuit 230 and the read/write circuit 240 of the operation circuit may be decoded by the data conversion circuit 270B. The decoded data may be outputted through the input and output circuit 260.

In the read operation, when a selected memory block 210MB is confirmed to be in the secure erase state based on the erase state information, the data read from the memory cells by the voltage supply circuit 230 and the read write circuit 240 of the operation circuit may be encoded again by the data conversion circuit 270B before the data is outputted through the input and output circuit 260.

An embodiment of the data conversion circuit 270B will be described below in detail.

Referring to FIG. 46, the data conversion circuit 270B may include a selecting circuit 275, an encoding circuit 271, and a decoding circuit 273. The encoding circuit 271 may include a first encoding circuit 271A and a second encoding circuit 271B. The first encoding circuit 271A may be configured to encode data inputted to be stored in the memory cells in the program operation. The second encoding circuit 271B may be configured to encode data read from the memory cells before outputting the data read from the memory cells in the read operation.

For example, in the read operation, when a selected memory block is confirmed to be in the non-erase state or the normal erase state based on the erase state information, the selecting circuit 275 may transfer data read from the memory cells (i.e., data inputted from the read/write circuit 250) to the decoding circuit 273. The decoding circuit 273 may decode the data read from the memory cells before the data is outputted to the external device since the data read from the memory cells is data encoded and stored in the memory cells in the program operation. Therefore, the decoding circuit 273 may decode the data read from the memory cells in order to generate data before the encoding operation. The decoded data may be outputted through the input and output circuit 260.

In the read operation, when a selected memory block is confirmed to be in the secure erase state based on the erase state information, the selecting circuit 275 may transfer data read from the memory block to the second encoding circuit 271B. The second encoding circuit 271B may encode the data read from the memory cells, and output the encoded data to the input and output circuit 260. The data read from the memory cells may be data stored in the memory cells in an encoding state by being encoded by the first encoding circuit 271A in the program operation. Accordingly, when the data stored in the memory cells is read out, the data read from the memory cells may be outputted through the input and output circuit 260 after being encoded again by the second encoding circuit 271B.

The data conversion circuit 160 of the memory controller 100, shown in FIG. 1, may be different from the data conversion circuit 270A and 270B shown in FIG. 4A or 4B in that the data conversion circuit 160 encodes and decodes data inputted through the internal bus 110 and subsequently outputs the encoded and decoded data through the internal bus 110. However, other than that described above, the data conversion circuit 160, shown in FIG. 1, may have the same configuration as the data conversion circuit 270A and 270B shown in FIG. 4A or 4B.

Figure 6B:
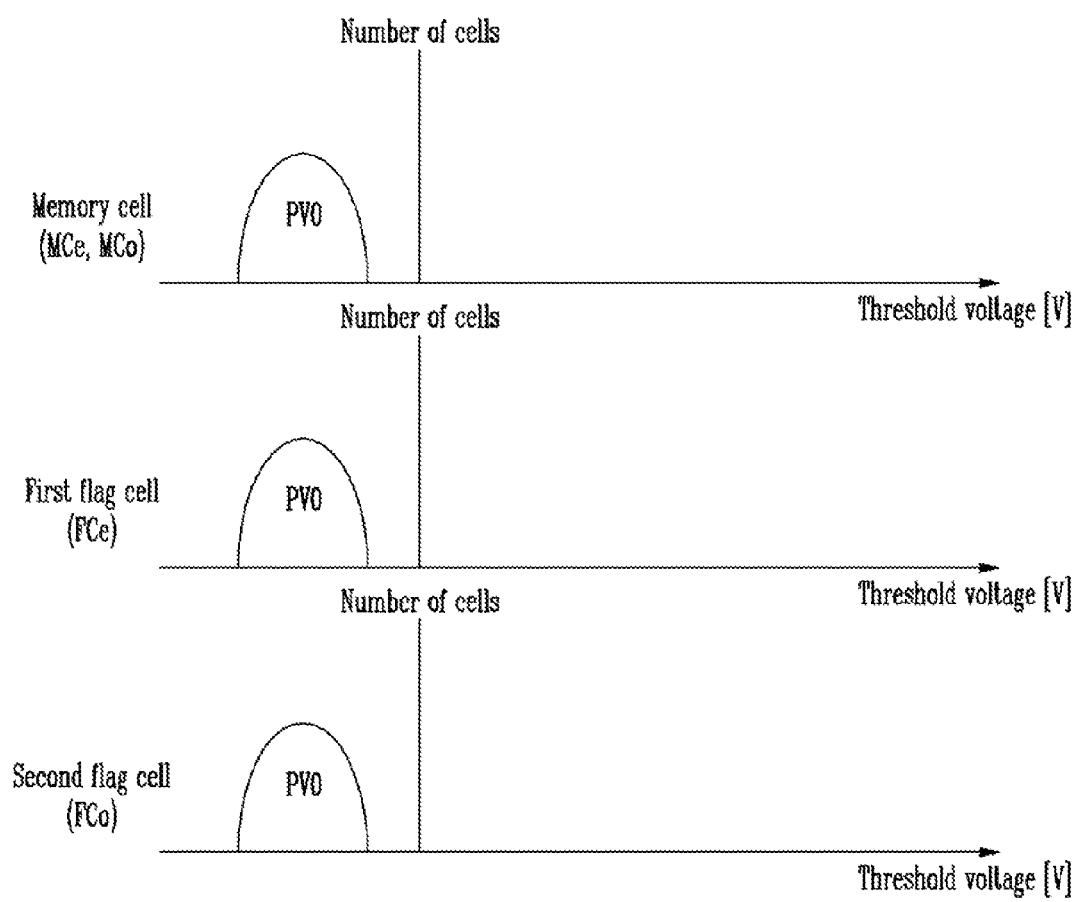
Figure 6C:
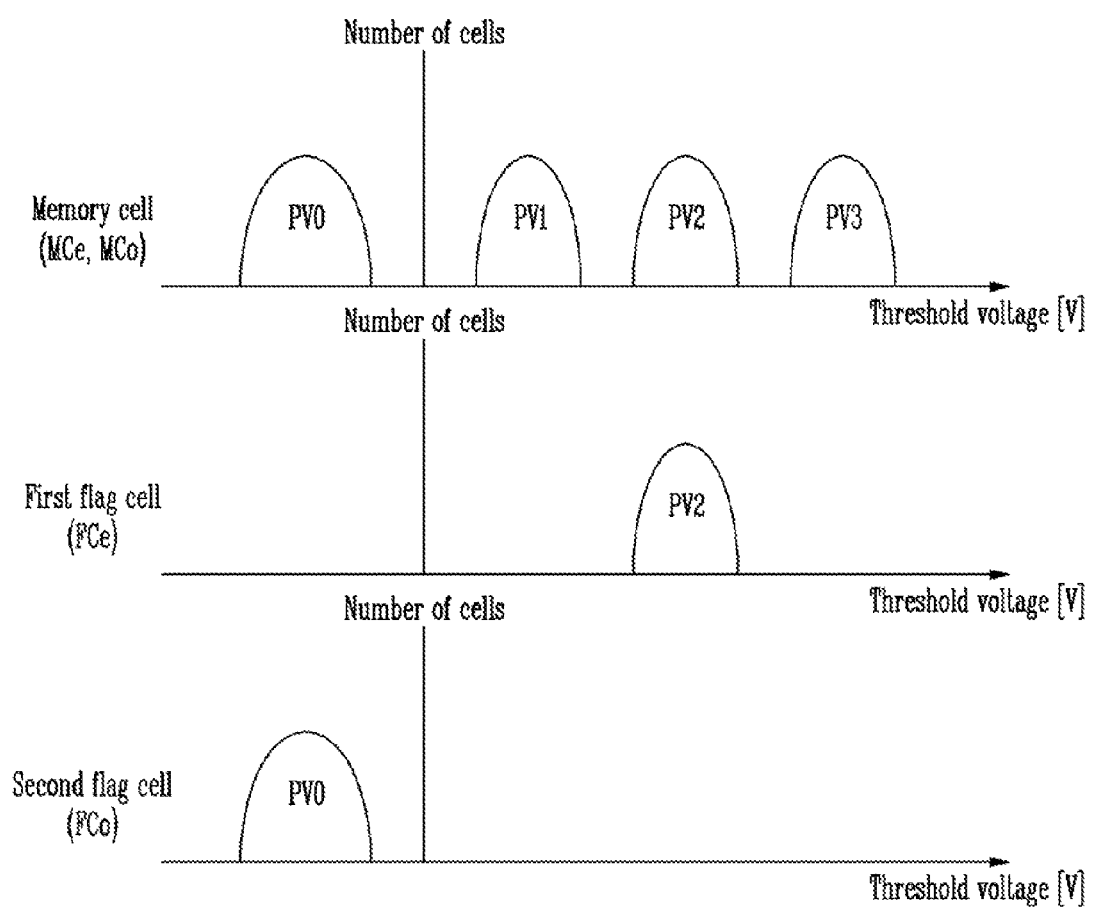

Hereinafter, a method of operating the semiconductor device described above will be described in detail. FIGS. 5A and 5B are flowcharts illustrating operations of a semiconductor device according to an embodiment of the present invention. FIGS. 6A to 6C are waveforms illustrating operations of a semiconductor device according to an embodiment of the present invention.

Referring to FIG. 5A, at a step S501, an erase command for the erase operation of the memory block may be inputted.

At a step S503 it may be confirmed whether the erase command is the normal erase command or the secure erase command. The processor 120 of the memory controller 100 may confirm the type of erase command and control the memory device 200 based on the confirmation result.

When the erase command is the normal erase command, information of the FTL 130 may be changed at a step S507. In other words, the memory controller 100 may change meta-information related to a selected memory block for performing the erase operation in the FTL 130 such that an address of the selected memory block may be included in an address of an erase state.

Referring to FIGS. 5A and 6A, when the erase command is confirmed as the secure erase command at step S503, the erase state information stored in the selected memory block may be changed at step S505. For example, when the memory block is in the non-erase state or the normal erase state, the erase state information may be stored as first data, for example, erase data (data indicating an erase state) in the second flag cell FCo included in the memory block of the memory device. When the memory block is in the secure erase state, the erase state information may be stored as second data, for example, program data (data indicating a program state) in the second flag cell FCo included in the memory block of the memory device. In other words, the second flag cell FCo may be changed from an erase state, for example, PV0, to a program state, for example, PV2, at step 505 when the erase command is confirmed as the secure erase command. The operation circuit 220 to 260 of the memory device 200 may perform the program operation of the second flag cell FCo in order to change the state of the second flag cell FCo.

For reference, the program state of the memory block may be stored in the first flag cell FCe. When threshold voltages of the memory cells are separately distributed into an erase level PV1 and three program levels PV1 to PV3 by storing two-bit data in each of the memory cells, the program data may be stored in the first flag cell FCe. In other words, the flag cell FCe may be in the program state. For example, in an MSB program operation for storing data in the memory cell, the first flag cell FCe may be changed from the erase state to the program state.

At the step S507, information of the memory block in the FTL 130 may be changed. In other words, the memory controller 100 may change meta-information related to a selected memory block for the erase operation in the FTL 130 such that an address of the selected memory block may be included in an address of an erase state.

An actual erase operation for erasing data stored in the memory cells of the memory block may not be performed. Accordingly, the threshold voltages of the memory cells may maintain the state of being separately distributed into the erase level PV0 and the three program levels PV1 to PV3. Even though data of the memory cells is not erased, since the meta-information of the selected memory block is changed in the FTL 130, a corresponding memory block may be treated as a memory block of the normal erase state.

Referring to FIGS. 5B and 6A, at step S511, a read command may be inputted. The read command may be a normal read command, or a read command for normally or abnormally recovering the data of the memory block on which the erase operation is performed.

At step S513, the erase state information of the selected memory block may be confirmed. The operation circuit 220 to 260 may read the data stored in the memory cells MCe and MCo and the flag cells FCe and FCo. The operation circuit 220 to 260 may confirm the erase state information of the memory block using the data read from the second flag cell FCo.

At step S515, it may be confirmed whether the memory block is in the secure erase state (a secure erase block) based on the data read from the second flag cell FCo. When the data read from the second flag cell FCo is the erase data or the second flag cell FCo is in the erase state, the memory block is confirmed as a non-erase block or a normal erase block. At a step S519, the data read from the memory cells MCe and MCo may be outputted without being subject to the encoding operation. When the data read from the memory cells is data encoded in the program operation, at step S519, the data read from the memory cells may be outputted after performing the decoding operation. The decoding operation of the data may be performed by the data conversion circuit 160 of the memory controller 100 shown in FIG. 1, or the data conversion unit 270B shown in FIG. 4B.

When the data read from the second flag cell FCo is program data or the second flag cell FCo is in the program state, at step S515, the memory block may be confirmed to be in the secure erase state. In order to protect data and prevent malicious data leakage at step S517, the read data may be encoded to prevent the data from being read. The operation of encoding the data may be performed by the data conversion circuit 160 of the memory controller 100 shown in FIG. 1, the data conversion circuit 270A shown in FIG. 4A, or the data conversion circuit 270B shown in FIG. 4B. When the data read from the memory cells is data stored in the memory cells after encoding the data in the program operation, the encoded data may be encoded again at step S517 after being read from the memory cells and before being outputted to the memory controller 100 or the host HOST.

The data read from the memory cells is outputted to the memory controller 100 or the host HOST at step S519 after being encoded by the data conversion circuit.

As described above, even when an operation for example, the read operation) for recovering the data of the memory block being in the secure erase state may be performed by a user, the user may obtain encoded data which cannot be decoded. Accordingly, even when the user loses a storing device, other users may be unable to obtain any data from the memory block that is in the secure erase state.

Referring to FIG. 6B, before the program operation for storing data in the memory block in the erase state is performed, the operation circuit may perform the erase operation of the memory block for erasing the data stored in the memory cells MCe and MCo of the memory block. As a result, threshold voltages of the memory cells MCe and MCo and the flag cells FCe and FCo may be distributed in the erase level PV0.

Referring to FIG. 6C, a least significant bit (LSB) program operation and the MSB program operation for storing data in the memory cells may be performed. As a result, the threshold voltages of the memory cells MCe and MCo may be divided into the erase level PV0 and the three program levels PV1 to PV3 depending on the data to be stored.

At this time, data, for example, program data, indicating that the MSB program operation is performed may be stored in the first flag cell FCe. Erase data indicating that the memory block is in the non-erase state may be stored in the second flag cell FCo as erase state information.

Although not shown, when only the LSB program operation for storing one-bit data in each of the memory cells is performed, the threshold voltages of the memory cells MCe and MCo may be separately distributed into the erase level PV0 and any one among the three program levels PV1 to PV3 depending on the data to be stored.

At this time, erase data indicating that only the LSB program operation is performed may be stored in the first flag, cell FCe. Erase data indicating that the memory block is in the non-erase state may be stored in the second flag cell FCo as the erase state information.

According to the embodiments of the present invention, data can be protected safely.

In the drawings and specification, typical embodiments of the present invention have been disclosed and, although specific terms are employed, they are used in a generic and descriptive sense only and not for purpose of limitation. As for the scope of the invention, it is to be set forth in the following claims. Therefore, it will be understood by those of ordinary skill in the art that various changes in form and details may be made without departing from the spirit and scope of the present invention as defined by the following claims.

What is claimed is:

1. A semiconductor device, comprising:
a memory block including memory cells for storing program data and one or more flag cells for storing erase state information;
an operation circuit suitable for performing a program operation, an erase operation, and a read operation on the memory cells and the flag cell; and
a data conversion circuit,
wherein the operation circuit reads data stored in the memory cells and the erase state information stored in the flag cell when the read operation is performed, and
the data conversion circuit suitable for encoding read data read from the memory cells based on the erase state information after the read operation is performed.

2. The semiconductor device of claim 1, wherein the operation circuit stores first data in the flag cell as the erase state information, when the memory block is in a non-erase state or a normal erase state, and
the operation circuit stores second data in the flag cell as the erase state information, when the memory block is in a secure erase state.

3. The semiconductor device of claim 1, wherein, when the memory block is changed in a secure erase state in response to a secure erase command, the operation circuit changes the flag cell from an erase state to a program state.

4. The semiconductor device of claim 2, wherein, in the read operation of the memory block, the operation circuit confirms the erase state information stored in the flag cell.

5. The semiconductor device of claim 4, wherein, when the erase state information is confirmed as the first data, the operation circuit outputs the read data read from the memory cells without the encoding of the data conversion circuit.

6. The semiconductor device of claim 4, wherein, when the erase state information is confirmed as the second data, the data conversion circuit encodes the read data read from the memory cells and the operation circuit outputs encoded data.

7. The semiconductor device of claim 1, wherein, in the program operation of the memory cells, the data conversion circuit encodes the program data to be stored in the memory cells, and the operation circuit stores encoded data in the memory cells.

8. The semiconductor device of claim 7, wherein the operation circuit confirms a state of the memory block based on the erase state information, and
wherein, when the memory block is confirmed to be in a secure erase state, the data conversion circuit encodes the read data read from the memory cells and the operation circuit outputs encoded data.

9. The semiconductor device of claim 7, wherein the operation circuit confirms a state of the memory block based on the erase state information, and wherein, when the memory block is confirmed to be in a non-erase state, the data conversion circuit decodes the read data read from the memory cells and the operation circuit outputs decoded data.

10. The semiconductor device of claim 7, wherein the data conversion circuit comprises:
a first encoding circuit suitable for encoding the program data to be stored in the memory cells; and
a second encoding circuit suitable for encoding the read data read from the memory cells.

11. A semiconductor device, comprising:
a memory device including a memory block having first memory cells for storing program data and a second memory cell for storing erase state information, wherein the memory device is suitable for performing a program operation, an erase operation, and a read operation on the memory block; and
a controller,
wherein the memory device reads data stored in the first memory cells and the erase state information stored in the second memory cell when the read operation is performed, and
the controller suitable for encoding read data read from the first memory cells based on the erase state information after the read operation.

12. The semiconductor device of claim 11, wherein the second memory cell stores first data as the erase state information, when the memory block is in a non-erase state or a normal erase state, and
the second memory cell stores second data as the erase state information when the memory block is in a secure erase state.

13. The semiconductor device of claim 11, wherein, when the memory block is changed in a secure erase state in response to a secure erase command, the memory device changes a threshold voltage of the second memory cell from an erase state to a program state.

14. The semiconductor device of claim 11, wherein, after the read operation of the memory block, the memory device outputs the erase state information to the controller.

15. The semiconductor device of claim 12, wherein, when the erase state information is confirmed as the first data, the controller outputs the read data without the encoding.

16. The semiconductor device of claim 11, wherein, when the erase state information is confirmed as the second data, the controller encodes the read data and outputs encoded data.

17. The semiconductor device of claim 11, wherein, in the program operation, the controller encodes the program data to be stored in the first memory cells and the memory device stores encoded data encoded by the controller in the first memory cells.

18. The semiconductor device of claim 17, wherein, the memory device outputs the erase state information to the controller, and the controller confirms a state of the memory block based on the erase state information, and
wherein, when the memory block is confirmed to be in a secure erase state based on the erase state information, the controller encodes the read data and outputs encoded data.

19. The semiconductor device of claim 17, wherein, the memory device outputs the erase state to the controller, and the controller confirms a state of the memory block based on the erase state information, and
wherein, when the memory block is confirmed to be in a non-erase state based on the erase state information, the controller decodes the read data and outputs decoded data.

20. The semiconductor device of claim 11, wherein, when a normal erase command is inputted for the erase operation, the controller changes meta-information related to the memory block, and when a secure erase command is inputted for the erase operation, the controller changes the meta-information related to the memory block and the memory device changes the erase state information stored in the second memory cell.

21. A semiconductor device, comprising:
a memory block including first memory cells for storing program data and a second memory cell for storing erase state information;
an operation circuit suitable for controlling the memory block; and
a data conversion circuit coupled to the operation circuit,
wherein the operation circuit reads the program data from the first memory cells and the erase state information from the second memory cell when a read operation is performed, and
after the read operation is performed, the data conversion circuit encodes the program data read from the first memory cells when the erase state information has a first value.

22. The semiconductor device of claim 21, the operation circuit receives the encoded data and output the encoded data.

23. The semiconductor device of claim 21, after the read operation is performed, the operation circuit outputs the program data read from the first memory cells without the encoding when the erase state information has a second value different from the first value.

24. The semiconductor device of claim 21, wherein the second memory cell stores the first value as the erase state information when the memory block is in a non-erase state or a normal erase state, and the second memory cell stores a second value different from the first value as the erase state information when the memory block is in a secure erase state.

\* \* \* \* \*